US009853160B2

(12) United States Patent
Jung et al.

(10) Patent No.: US 9,853,160 B2
(45) Date of Patent: Dec. 26, 2017

(54) SEMICONDUCTOR DEVICES AND METHODS OF FABRICATING THE SAME

(71) Applicant: Samsung Electronics Co., Ltd., Suwon-si (KR)

(72) Inventors: Sujin Jung, Hwaseong-si (KR); JinBum Kim, Seoul (KR); Kang Hun Moon, Incheon (KR); Kwan Heum Lee, Suwon-si (KR); Byeongchan Lee, Yongin-si (KR); Choeun Lee, Pocheon-si (KR); Yang Xu, Hwaseong-si (KR)

(73) Assignee: SAMSUNG ELECTRONICS CO., LTD., Samsung-ro, Yeongtong-gu, Suwon-si, Gyeonggi-do (KR)

( * ) Notice: Subject to any disclaimer, the term of this patent is extended or adjusted under 35 U.S.C. 154(b) by 0 days.

(21) Appl. No.: 15/135,566

(22) Filed: Apr. 22, 2016

(65) Prior Publication Data

US 2016/0351715 A1    Dec. 1, 2016

(30) Foreign Application Priority Data

May 26, 2015    (KR) .................. 10-2015-0073121

(51) Int. Cl.
*H01L 27/088* (2006.01)
*H01L 29/78* (2006.01)
*H01L 29/08* (2006.01)
*H01L 29/66* (2006.01)

(52) U.S. Cl.
CPC ...... *H01L 29/7851* (2013.01); *H01L 29/0847* (2013.01); *H01L 29/66795* (2013.01); *H01L 29/7848* (2013.01)

(58) Field of Classification Search
CPC .............. H01L 29/41791; H01L 29/7856
USPC ........................................ 257/365
See application file for complete search history.

(56) References Cited

U.S. PATENT DOCUMENTS

| | | | |
|---|---|---|---|
| 6,645,797 B1 | 11/2003 | Buynoski et al. | |
| 6,924,178 B2 | 8/2005 | Beintner | |
| 7,315,994 B2 | 1/2008 | Aller et al. | |
| 7,955,928 B2 | 6/2011 | Chan et al. | |
| 8,021,949 B2 | 9/2011 | Cheng et al. | |
| 8,169,024 B2 | 5/2012 | Cheng et al. | |
| 8,242,568 B2 | 8/2012 | Ikeda et al. | |
| 8,716,786 B2 * | 5/2014 | Baumgartner | .... H01L 29/66818 257/331 |
| 8,729,607 B2 | 5/2014 | Itokawa et al. | |
| 8,729,634 B2 | 5/2014 | Shen et al. | |
| 8,815,659 B2 * | 8/2014 | Chi | .......... H01L 27/0886 257/E21.637 |
| 9,029,930 B2 | 5/2015 | Kelly et al. | |
| 2006/0177977 A1 | 8/2006 | Chan et al. | |

(Continued)

*Primary Examiner* — Chandra Chaudhari
(74) *Attorney, Agent, or Firm* — Muir Patent Law, PLLC

(57) ABSTRACT

A semiconductor device is disclosed. The device includes a substrate including an active region defined by a device isolation layer, a fin pattern protruding from the substrate and extending in a first direction, the fin pattern including a gate fin region and a source/drain fin region, a gate pattern disposed on the gate fin region to extend in a second direction crossing the first direction, and a source/drain portion provided on a sidewall of the source/drain fin region. When measured in the second direction, a width of the source/drain fin region is different from a width in the second direction of the gate fin region.

20 Claims, 17 Drawing Sheets

(56) References Cited

U.S. PATENT DOCUMENTS

2014/0134814 A1     5/2014    Wong et al.
2014/0264604 A1     9/2014    Tsai et al.

* cited by examiner

SEMICONDUCTOR DEVICES AND METHODS OF FABRICATING THE SAME

CROSS-REFERENCE TO RELATED APPLICATION

This U.S. non-provisional patent application claims priority under 35 U.S.C. §119 to Korean Patent Application No. 10-2015-0073121, filed on May 26, 2015, in the Korean Intellectual Property Office, the entire contents of which are hereby incorporated by reference.

BACKGROUND

The present disclosure relates to a semiconductor device and a method of fabricating the same, and in particular, to semiconductor devices including fin field effect transistors (hereinafter, fin-FETs) and methods of fabricating the same.

A semiconductor device may include integrated circuits (ICs) consisting of metal-oxide-semiconductor field-effect transistors (MOS-FETs). As reduction in size and design rule of semiconductor devices is accelerated, the MOS-FETs are being increasingly scaled down. The reduction in size of the MOS-FETs may lead to deterioration in operational properties of the semiconductor device. A variety of studies are being conducted to overcome technical limitations associated with the scale-down of semiconductor devices and to provide high performance semiconductor devices.

SUMMARY

Example embodiments of the inventive concept provide a semiconductor device with improved electric characteristics.

According to example embodiments of the inventive concept, a semiconductor device may include a substrate including an active region defined by a device isolation layer, a fin pattern protruding from the substrate and extending in a first direction, the fin pattern including a gate fin region and a source/drain fin region, a gate pattern disposed on the gate fin region to extend in a second direction crossing the first direction, and a source/drain portion provided on a sidewall of the source/drain fin region. When measured in the second direction, a width of the source/drain fin region may be different from a width of the gate fin region.

In some embodiments, the width of the source/drain fin region may be less than the width of the gate fin region.

In some embodiments, a width of an upper portion of the source/drain fin region may be less than a width of a lower portion of the source/drain fin region.

In some embodiments, the gate fin region may have a top surface that is positioned at substantially the same level as a top surface of the source/drain fin region.

In some embodiments, the gate fin region may have a top surface that is positioned at a level different from a top surface of the source/drain fin region.

In some embodiments, the top surface of the source/drain fin region may be positioned at a level lower than the top surface of the gate fin region.

In some embodiments, the source/drain fin region may include an impurity region.

In some embodiments, the impurity region may be formed throughout the source/drain fin region.

In some embodiments, the source/drain fin region with the impurity region, along with the source/drain portion, may constitute a source/drain electrode.

In some embodiments, the sidewall of the source/drain fin region may include at least a portion having a slanted profile According to example embodiments of the inventive concept, a semiconductor device may include a substrate including an active region defined by a device isolation layer, a fin pattern provided on the active region and extending in a first direction, the fin pattern including a gate fin region to extend in a second direction crossing the first direction and a source/drain fin region, a gate pattern provided on the gate fin region, and a source/drain portion provided on a sidewall of the source/drain fin region. When measured in the second direction, a width of source/drain fin region may be less than a width of the active region.

In some embodiments, a top surface of the portion of the active region may be in contact with the source/drain portion.

In some embodiments, when measured in the second direction, the width of the source/drain fin region may be less than a width of the gate fin region.

In some embodiment, the source/drain fin region may comprise an impurity region.

In some embodiment, the impurity region may be formed in an entire region of the source/drain fin region.

In some embodiment, the source/drain fin region may be a portion of the substrate, and the source/drain portion may be an epitaxial pattern.

In some embodiment, a top surface of the source/drain fin region may be positioned at a lower level as that of the gate fin region.

According to example embodiments of the inventive concept, a semiconductor device may include a substrate including an active region defined by a device isolation layer, a fin pattern provided on the active region and extending in a first direction, the fin pattern comprising a gate fin region and a source/drain fin region, a gate pattern provided on the gate fin region to extend in a second direction crossing the first direction, and a source/drain portion provided on a sidewall of the source/drain fin region. When measured in the second direction, a width of source/drain fin region may be less than a width of the gate fin region, and a top surface of the source/drain fin region is positioned at a lower level as that of the gate fin region. A sidewall of the source/drain fin region may include a slanted portion.

In some embodiment, the source/drain fin region may be a portion of the substrate, and the source/drain portion may be an epitaxial pattern

BRIEF DESCRIPTION OF THE DRAWINGS

Example embodiments will be more clearly understood from the following brief description taken in conjunction with the accompanying drawings. The accompanying drawings represent non-limiting, example embodiments as described herein.

1, of a semiconductor device according to certain example embodiments of the inventive concept.

Figure 3A:
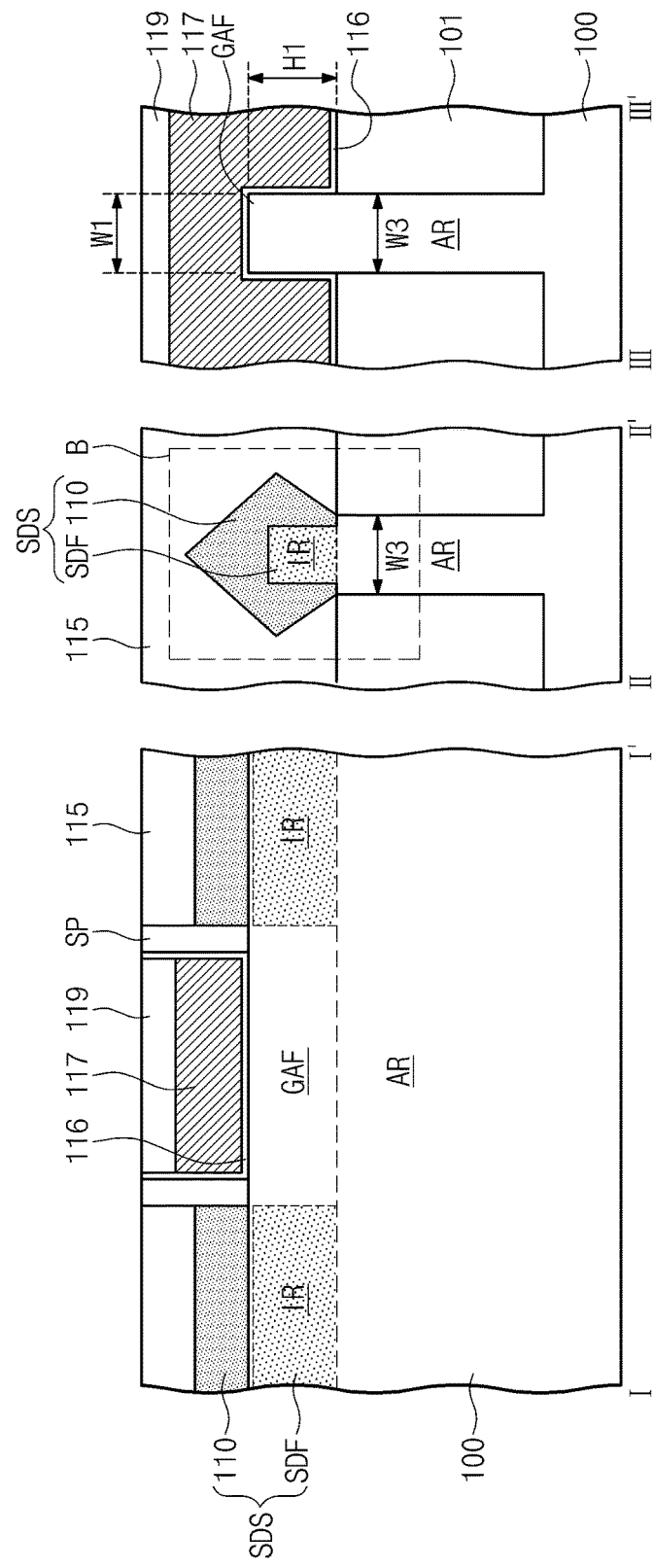
FIG. 3A is a sectional view illustrating vertical sections, taken along lines I-I', II-II', and III-III', respectively, of FIG.
Figure 3B:
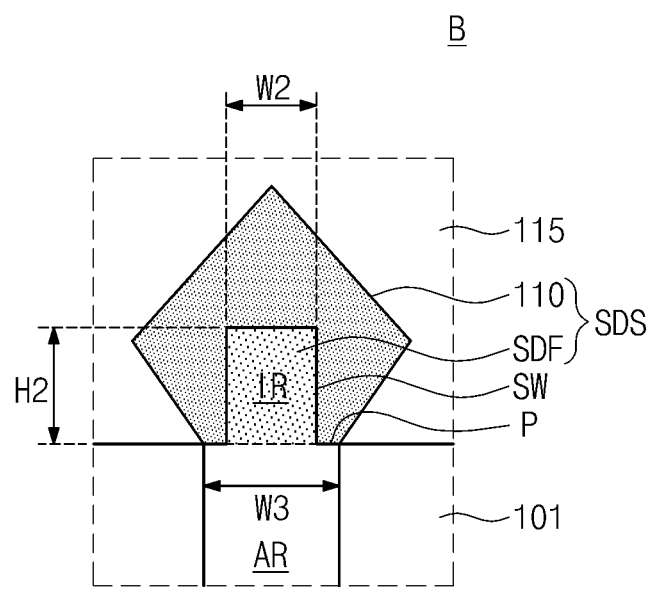

FIG. 3B is an enlarged sectional view illustrating portion 'B' of FIG. 3A.

Figure 1:
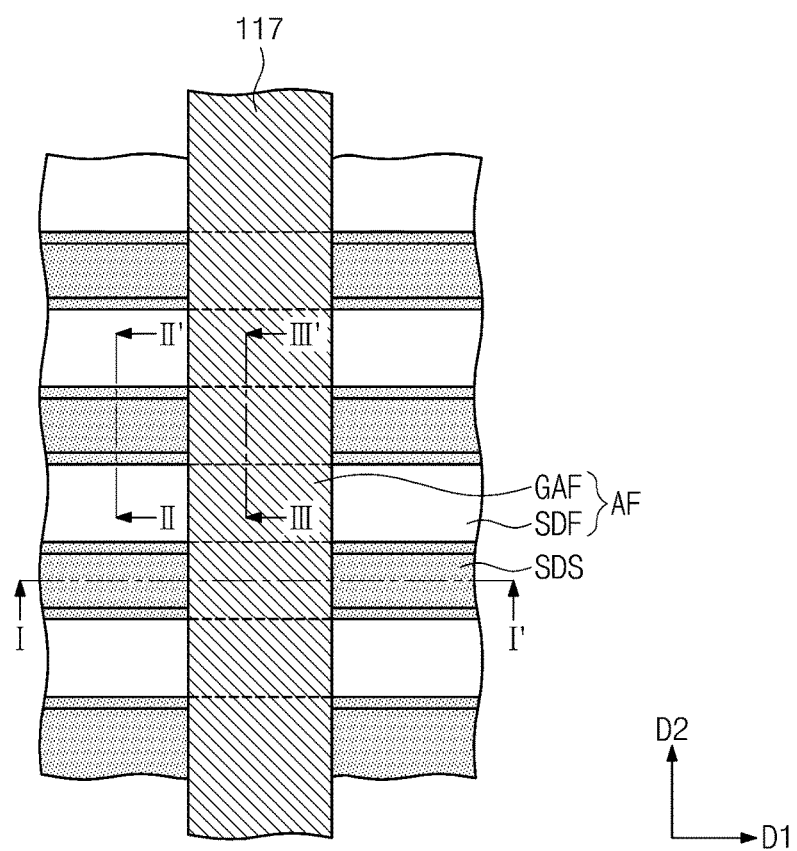
FIG. 1 is a plan view illustrating a semiconductor device according to example embodiments of the inventive concept.
Figure 4A:
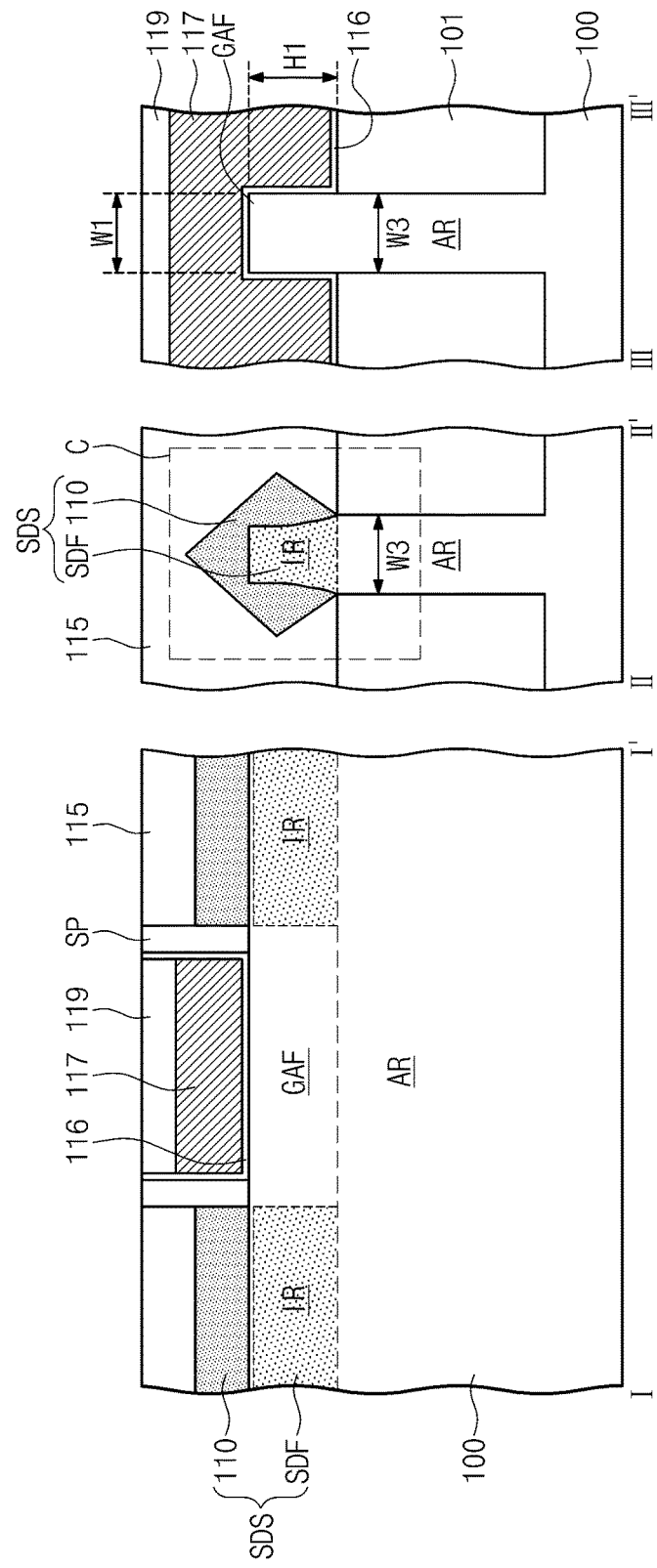

FIG. 4A is a sectional view illustrating vertical sections, taken along lines I-I', II-II', and III-III', respectively, of FIG. 1, of a semiconductor device according to certain example embodiments of the inventive concept.

Figure 4B:
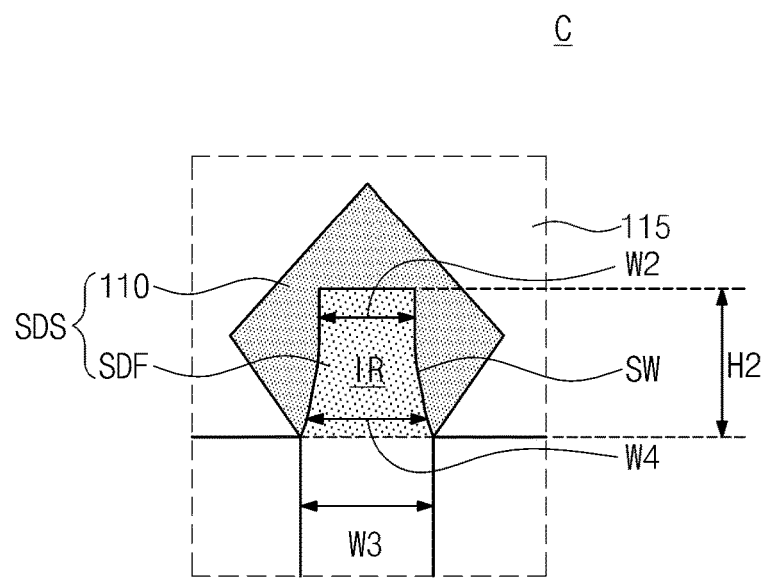

FIG. 4B is an enlarged sectional view illustrating portion 'C' of FIG. 4A.

FIGS. 5 through 12 are sectional views, which illustrate a method of fabricating a semiconductor device according to certain example embodiments of the inventive concept, and each of which illustrates vertical sections taken along lines I-I', II-II', and III-III', respectively, of FIG. 1.

Figure 13:
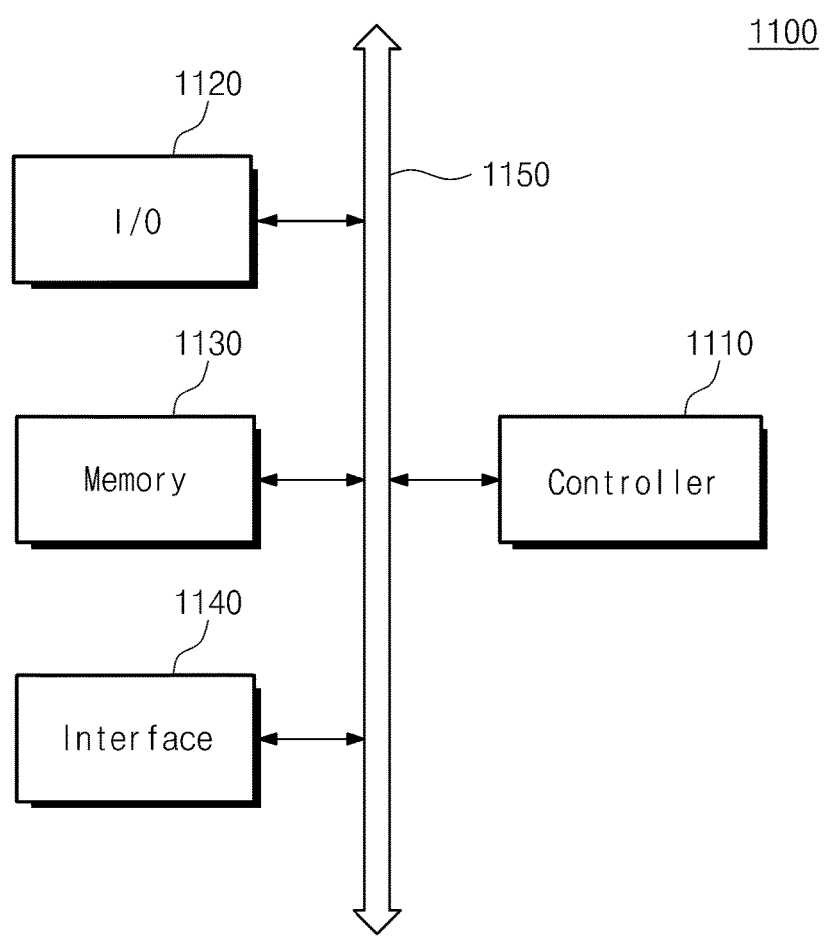

FIG. 13 is a block diagram illustrating an example of an electronic system including a semiconductor device according to example embodiments of the inventive concept.

Figure 14:
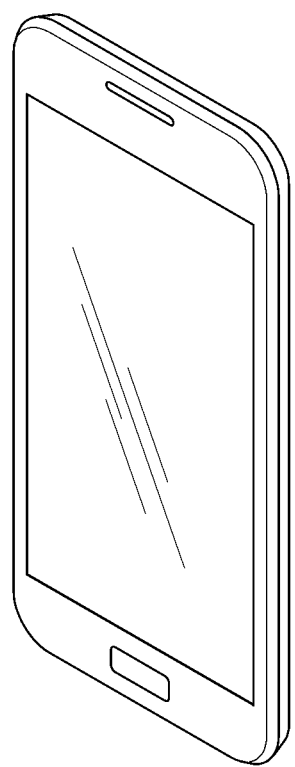

FIG. 14 is a schematic view illustrating an example of various electronic devices, to which an electronic system according to example embodiments of the inventive concept can be applied.

It should be noted that these figures are intended to illustrate the general characteristics of methods, structure and/or materials utilized in certain example embodiments and to supplement the written description provided below. These drawings are not, however, to scale and may not precisely reflect the precise structural or performance characteristics of any given embodiment, and should not be interpreted as limiting the range of values or properties encompassed by example embodiments. For example, the relative thicknesses and positioning of molecules, layers, regions and/or structural elements may be reduced or exaggerated for clarity. The use of similar or identical reference numbers in the various drawings is intended to indicate the presence of a similar or identical element or feature.

In addition, though the different figures show variations of exemplary embodiments, these figures are not necessarily intended to be mutually exclusive from each other. Rather, as will be seen from the context of the detailed description below, certain features depicted and described in different figures can be combined with other features from other figures to result in various embodiments, when taking the figures and their description as a whole into consideration.

DETAILED DESCRIPTION

Example embodiments of the inventive concepts will now be described more fully with reference to the accompanying drawings, in which example embodiments are shown. Example embodiments of the inventive concepts may, however, be embodied in many different forms and should not be construed as being limited to the embodiments set forth herein.

It will be understood that when an element is referred to as being "connected" or "coupled" to another element, it can be directly connected or coupled to the other element or intervening elements may be present. In contrast, when an element is referred to as being "directly connected" or "directly coupled" to another element, or as "contacting" or "in contact with" another element, there are no intervening elements present. Other words used to describe the relationship between elements or layers should be interpreted in a like fashion (e.g., "between" versus "directly between," "adjacent" versus "directly adjacent," "on" versus "directly on"). As used herein the term "and/or" includes any and all combinations of one or more of the associated listed items.

It will be understood that, although the terms first, second, third etc. may be used herein to describe various elements, components, regions, layers and/or sections, these elements, components, regions, layers and/or sections should not be limited by these terms. Unless the context indicates otherwise, these terms are only used to distinguish one element, component, region, layer or section from another element, component, region, layer or section, for example as a naming convention. Thus, a first element, component, region, layer or section discussed below in one section of the specification could be termed a second element, component, region, layer or section in another section of the specification or in the claims without departing from the teachings of the present invention. In addition, in certain cases, even if a term is not described using "first," "second," etc., in the specification, it may still be referred to as "first" or "second" in a claim in order to distinguish different claimed elements from each other.

Spatially relative terms, such as "beneath," "below," "lower," "above," "upper" and the like, may be used herein for ease of description to describe one element or feature's relationship to another element(s) or feature(s) as illustrated in the figures. It will be understood that the spatially relative terms are intended to encompass different orientations of the device in use or operation in addition to the orientation depicted in the figures. For example, if the device in the figures is turned over, elements described as "below" or "beneath" other elements or features would then be oriented "above" the other elements or features. Thus, the exemplary term "below" can encompass both an orientation of above and below. The device may be otherwise oriented (rotated 90 degrees or at other orientations) and the spatially relative descriptors used herein interpreted accordingly.

The terminology used herein is for the purpose of describing particular embodiments only and is not intended to be limiting of example embodiments. As used herein, the singular forms "a," "an" and "the" are intended to include the plural forms as well, unless the context clearly indicates otherwise. It will be further understood that the terms "comprises", "comprising", "includes" and/or "including," if used herein, specify the presence of stated features, integers, steps, operations, elements and/or components, but do not preclude the presence or addition of one or more other features, integers, steps, operations, elements, components and/or groups thereof.

Embodiments described herein will be described referring to plan views and/or cross-sectional views by way of ideal schematic views. Accordingly, the exemplary views may be modified depending on manufacturing technologies and/or tolerances. Therefore, the disclosed embodiments are not limited to those shown in the views, but include modifications in configuration formed on the basis of manufacturing processes. Therefore, regions exemplified in figures may have schematic properties, and shapes of regions shown in figures may exemplify specific shapes of regions of elements to which aspects of the invention are not limited.

Although corresponding plan views and/or perspective views of some cross-sectional view(s) may not be shown, the cross-sectional view(s) of device structures illustrated herein provide support for a plurality of device structures that extend along two different directions as would be illustrated in a plan view, and/or in three different directions as would be illustrated in a perspective view. The two different directions may or may not be orthogonal to each other. The three different directions may include a third direction that may be orthogonal to the two different directions. The plurality of device structures may be integrated in a same electronic device. For example, when a device structure (e.g., a memory cell structure or a transistor structure) is illustrated in a cross-sectional view, an electronic device may include a plurality of the device structures (e.g., memory cell structures or transistor structures), as would be illustrated by a plan view of the electronic device. The plurality of device structures may be arranged in an array and/or in a two-dimensional pattern.

Terms such as "same," "equal," "planar," or "coplanar," as used herein when referring to orientation, layout, location, shapes, sizes, amounts, or other measures do not necessarily mean an exactly identical orientation, layout, location, shape, size, amount, or other measure, but are intended to encompass nearly identical orientation, layout, location, shapes, sizes, amounts, or other measures within acceptable variations that may occur, for example, due to manufacturing processes. The term "substantially" may be used herein to reflect this meaning. Terms such as "exactly" or "identical" may be used to indicate no such variation.

As used herein, a semiconductor device may refer to any of the various devices such as shown in the various figures, and may also refer, for example, to one or more transistors or a device such as a semiconductor chip (e.g., memory chip and/or logic chip formed on a die), a stack of semiconductor chips, a semiconductor package including one or more semiconductor chips stacked on a package substrate, or a package-on-package device including a plurality of packages. These devices may be formed using ball grid arrays, wire bonding, through substrate vias, or other electrical connection elements, and may include memory devices such as volatile or non-volatile memory devices.

An electronic device, as used herein, may refer to these semiconductor devices, but may additionally include products that include these devices, such as a memory module, a hard drive including additional components, or a mobile phone, laptop, tablet, desktop, camera, or other consumer electronic device, etc.

Unless otherwise defined, all terms (including technical and scientific terms) used herein have the same meaning as commonly understood by one of ordinary skill in the art to which example embodiments of the inventive concepts belong. It will be further understood that terms, such as those defined in commonly-used dictionaries, should be interpreted as having a meaning that is consistent with their meaning in the context of the relevant art and will not be interpreted in an idealized or overly formal sense unless expressly so defined herein.

Figure 2A:
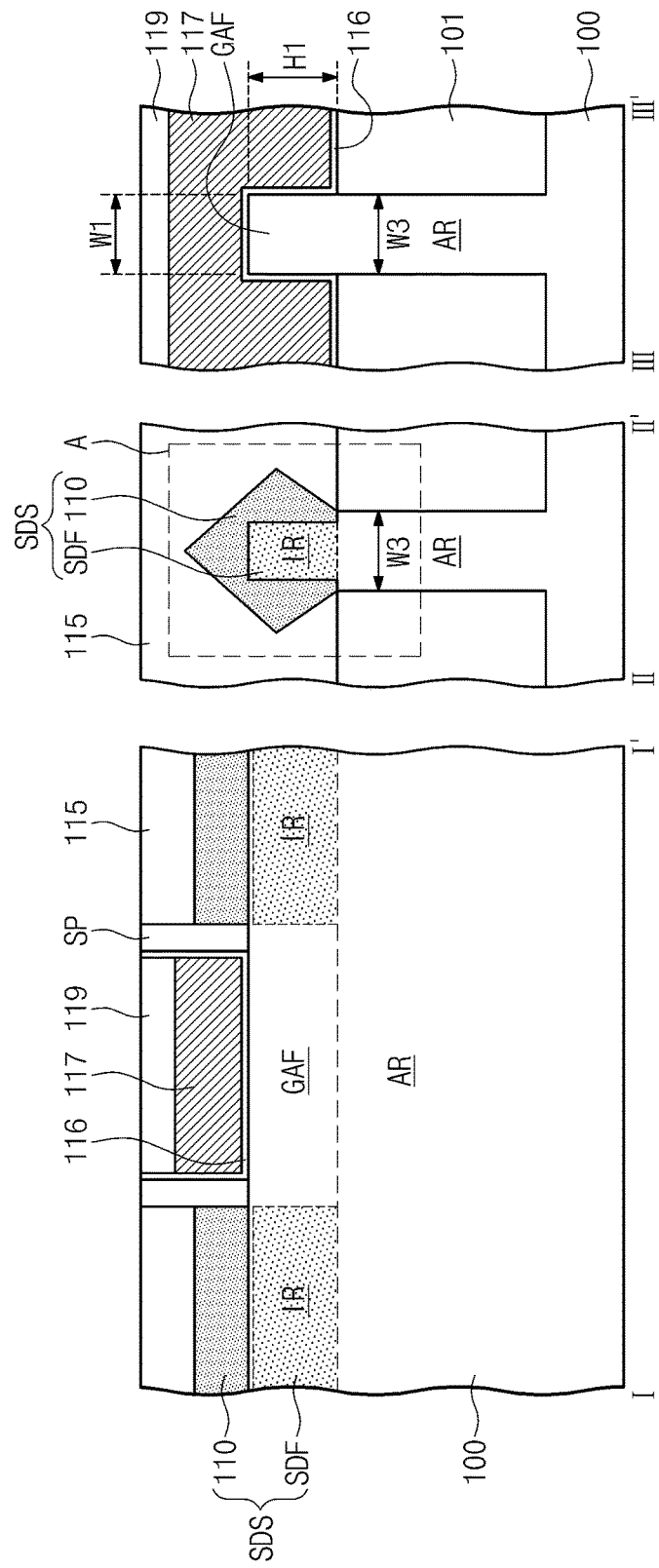
FIG. 2A is a sectional view illustrating vertical sections, taken along lines I-I', II-II', and III-III', respectively, of FIG. 1, of a semiconductor device according to certain example embodiments of the inventive concept.
Figure 2B:
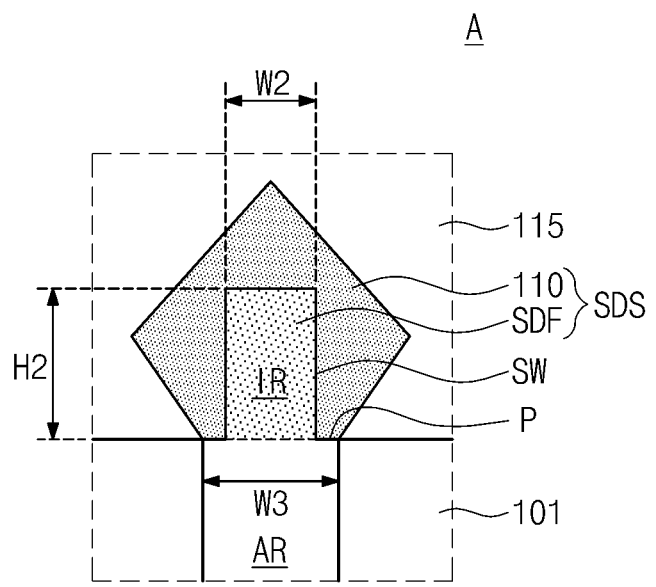
FIG. 2B is an enlarged sectional view illustrating portion 'A' of FIG. 2A.

FIG. 1 is a plan view illustrating a semiconductor device according to example embodiments of the inventive concept. FIG. 2A is a sectional view illustrating vertical sections, taken along lines I-I', II-II', and III-III', respectively, of FIG. 1, of a semiconductor device according to an example embodiment of the inventive concept. FIG. 2B is an enlarged sectional view illustrating portion 'A' of FIG. 2A.

Referring to FIGS. 1 and 2A, a device isolation layer 101 may be provided in a substrate 100 to define an active region AR. In some embodiments, the substrate 100 may be a silicon wafer, a silicon-germanium wafer, or a germanium wafer. Fins AF may be provided on the active region AR. The fins AF may be positioned at a level higher than a top surface of the device isolation layer 101 and may have an upwardly protruding structure. The fins AF may protrude over the substrate 100. The fins AF may extend parallel to a first direction D1 and may be arranged in a second direction D2 crossing the first direction D1. Each of the fins AF may include a gate fin region GAF and source/drain fin region SDF. In certain embodiments, the gate fin region GAF and the source/drain fin region SDF may be provided to have sidewalls SW extending upward with respect to (e.g., perpendicular to) a top surface of the substrate 100.

Referring to FIG. 2B, in conjunction with FIGS. 1 and 2A, the gate fin region GAF may have a width W1 different from a width W2 of the source/drain fin region SDF, when measured in the second direction D2. In some embodiments, the width W1 of the gate fin region GAF may be greater than the width W2 of the source/drain fin region SDF (i.e., W1>W2). When measured in the second direction D2, a portion of the active region AR of the substrate 100 positioned below the source/drain fin region SDF and the gate fin region GAF may have a width W3 that is greater than the width W2 of the source/drain fin region SDF and is substantially equal to the width W1 of the gate fin region GAF (i.e., W3=W1>W2). Accordingly, as shown in FIG. 2B, the portion of the active region AR positioned below the source/drain fin region SDF may have a top surface P exposed by the source/drain fin region SDF.

A height H1 of the gate fin region GAF may be substantially equal to a height H2 of the source/drain fin region SDF. For example, a top surface of the gate fin region GAF may be positioned at substantially the same level as that of the source/drain fin region SDF.

A gate pattern 117 may be provided to cross the fins AF and the device isolation layer 101. The gate pattern 117 may be disposed on the gate fin region GAF. The gate pattern 117 may extend in the second direction D2. The gate pattern 117 may be formed of or include, for example, at least one of metal nitrides (e.g., TiN, TaN, AlN, WN, or MoN), metals (e.g., W, Al, or Cu), metal silicides, and semiconductor materials (e.g., Si).

A gate insulating pattern 116 may be provided between the substrate 100 and the gate pattern 117. The gate insulating pattern 116 may be in contact with the gate fin region GAF, spacers SP, and the device isolation layer 101 and may have a substantially uniform thickness. The gate insulating pattern 116 may be formed of or include at least one of, for example, silicon oxide and high-k dielectric materials (e.g., HfO2, HfSiO, HfSiON, HfON, HfAlO, HfLaO, or TaO$_2$).

A capping pattern 119 may be provided on the gate pattern 117. The capping pattern 119 may be formed of or include at least one of, for example, silicon oxide, silicon nitride, and silicon oxynitride.

The spacers SP may be provided on opposite sidewalls of the gate pattern 117. For example, the spacers SP may be provided to cover sidewalls of the gate insulating pattern 116, the gate pattern 117, and the capping pattern 119. The spacers SP may be formed of or include, for example, at least one of silicon nitride or silicon oxide.

A source/drain portion 110 may be provided on the source/drain fin region SDF of the fins AF. For example, the source/drain portion 110 may be provided to cover a surface of the source/drain fin region SDF. The source/drain portion 110 may be in contact with the surface of the source/drain fin region SDF. The source/drain portion 110 may be positioned at a level higher than the top surface of the device isolation layer 101. The source/drain portion 110 may have a pentagonal vertical section. For example, the source/drain portion 110 may have sidewalls protruding or tapering toward a direction away from a bottom surface of the source/drain portion 110. The sidewalls of the source/drain portion 110 may be spaced apart from the device isolation layer 101. In one embodiment, the sidewalls of the source/drain portion 110 may not be in contact with the device isolation layer 101. Furthermore, the source/drain portion 110 may have a top portion tapering in an upward direction. A bottom surface of the source/drain portion 110 may be positioned at substantially the same level as the top surface of the device isolation layer 101 and may be in contact with the top surface P of the portion of the active region AR.

The source/drain portion 110 may be a structure grown by an epitaxial growth process using the source/drain fin region SDF as a seed layer. For example, the source/drain portion 110 may be an epitaxial pattern grown from the substrate 100. In the case of PMOS fin-FETs, a source/drain structure SDS may be configured to apply a compressive force to the gate fin region GAF. Mobility of holes passing through the channel region may increase by the compressive force. In the case where the substrate 100 is a silicon wafer, the source/drain structure SDS may be formed of silicon-germanium or germanium, and this may make it possible to exert the compressive force from the source/drain structure SDS to the gate fin region GAF. In the case of NMOS fin-FETs, the source/drain structure SDS may be configured to apply a tensile force to the gate fin region GAF. Mobility of electrons passing through the channel region may increase by the tensile force. In the case where the substrate 100 is a silicon wafer, the source/drain structure SDS may be formed of silicon-carbide, and this may make it possible to induce the tensile force from the source/drain structure SDS into the gate fin region GAF.

The source/drain portion 110 may contain impurities. In some embodiments, such impurities may be at least one of, for example, phosphorus (P), carbon (C), boron (B), or tin (Sn).

The source/drain fin region SDF may include an impurity region IR. The impurity region IR may be formed in the entire region of the source/drain fin region SDF. In some embodiments, the impurity region IR may contain impurities that are of the same kind as the source/drain fin region SDF. In certain embodiments, at least one of, for example, phosphorus (P), carbon (C), boron (B), or tin (Sn) may be contained in the impurity region IR. The source/drain structure SDS may include the source/drain portion 110 and the source/drain fin region SDF.

In the case of PMOS fin-FETs, the source/drain structure SDS may be doped with p-type impurities. In the case of NMOS fin-FETs, the source/drain structure SDS may be doped with n-type impurities.

An interlayer insulating layer 115 may be provided on the substrate 100. The interlayer insulating layer 115 may cover the source/drain portion 110. The interlayer insulating layer 115 may include an insulating material (e.g., silicon oxide or silicon nitride).

FIG. 3A is a sectional view illustrating vertical sections, taken along lines I-I', II-II', and III-III', respectively, of FIG. 1, of a semiconductor device according to an example embodiment of the inventive concept. FIG. 3B is an enlarged sectional view illustrating portion 'B' of FIG. 3A. In the following description of FIGS. 3A and 3B, elements previously described with reference to FIGS. 1, 2A, and 2B may be identified by a similar or identical reference number without repeating an overlapping description thereof, for the sake of brevity.

Referring to FIGS. 3A and 3B, when measured in the second direction D2, the width W1 of the gate fin region GAF may be different from the width W2 of the source/drain fin region SDF. As an example, the width W1 of the gate fin region GAF may be greater than the width W2 of the source/drain fin region SDF (i.e., W1>W2). When measured in the second direction D2, a portion of the active region AR of the substrate 100 positioned below the source/drain fin region SDF and the gate fin region GAF may have a width W3 that is greater than the width W2 of the source/drain fin region SDF and is substantially equal to the width W1 of the gate fin region GAF (i.e., W3=W1>W2).

The height H1 of the gate fin region GAF may be greater than the height H2 of the source/drain fin region SDF. In certain embodiments, the gate fin region GAF may have a top surface positioned at a higher level than the top surface of the source/drain fin region SDF.

FIG. 4A is a sectional view illustrating vertical sections, taken along lines I-I', II-II', and III-III', respectively, of FIG. 1, of a semiconductor device according to an example embodiment of the inventive concept. FIG. 4B is an enlarged sectional view illustrating portion 'C' of FIG. 4A. In the following description of FIGS. 4A and 4B, elements previously described with reference to FIGS. 1, 2A, and 2B may be identified by a similar or identical reference number without repeating an overlapping description thereof, for the sake of brevity.

Referring to FIGS. 4A and 4B, each of the fins GAF may include the gate fin region GAF and the source/drain fin region SDF. The gate fin region GAF may be provided to have a sidewall extending at an angle (e.g., an acute angle) to the top surface of the substrate 100. For example, at least a portion of the sidewall SW of the source/drain fin region SDF may have a slanted side profile, or the sidewall SW of the source/drain fin region SDF may have a concave side profile, which is curved in a direction toward a center thereof. Accordingly, when measured in the second direction D2, upper and lower portions of the source/drain fin region SDF may have widths W2 and W4, respectively, which are different from each other. As an example, the width W4 of the lower portion of the source/drain fin region SDF may be substantially greater than the width W2 of the upper portion of the source/drain fin region SDF.

Referring to FIGS. 4A and 4B, in conjunction with FIG. 1, the width W1 of the gate fin region GAF may be different from the widths W2 and W4 of the source/drain fin region SDF, when measured in the second direction D2. In some embodiments, the width W1 of the gate fin region GAF may be greater than the widths W2 and W4 of the source/drain fin region SDF (i.e., W1>W2 and W1>W4). When measured in the second direction D2, a portion of the active region AR of the substrate 100 positioned below the source/drain fin region SDF and the gate fin region GAF may have a width W3 that is greater than the widths W2 and W4 of the source/drain fin region SDF and is substantially equal to the width W1 of the gate fin region GAF (i.e., W3=W1, W1>W2, and W1>W4).

As shown in FIG. 4A, the height H1 of the gate fin region GAF may be substantially equal to the height H2 of the source/drain fin region SDF. For example, the top surface of the gate fin region GAF may be positioned at substantially the same level as that of the source/drain fin region SDF. Although not illustrated in the drawings, in certain embodiments, the height H1 of the gate fin region GAF may be greater than the height H2 of the source/drain fin region SDF. For example, the top surface of the gate fin region GAF may be positioned at a higher level than that of the source/drain fin region SDF.

FIGS. 5 through 12 are sectional views, which illustrate a method of fabricating a semiconductor device according to an example embodiment of the inventive concept, and each of which illustrates vertical sections taken along lines I-I', II-II', and III-III', respectively, of FIG. 1.

Figure 5:
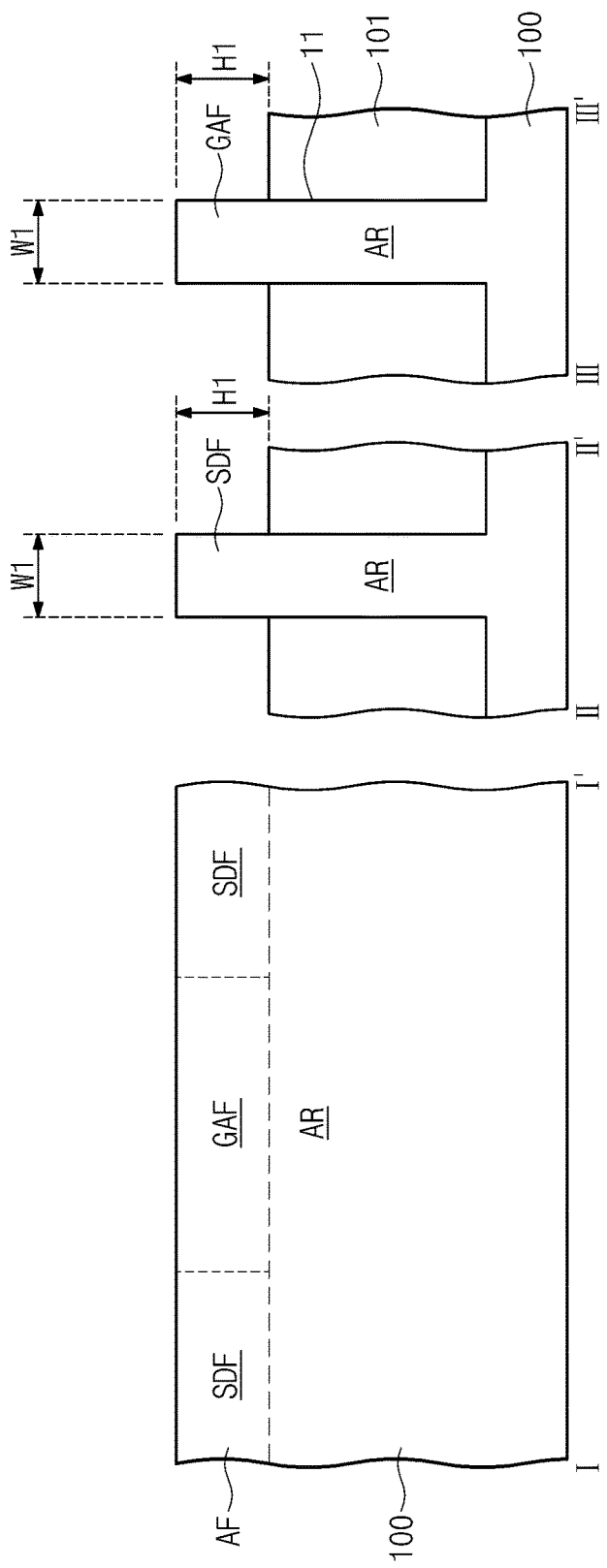

Referring to FIG. 5, the device isolation layer 101 may be formed in the substrate 100. The formation of the device isolation layer 101 may include forming trenches 11 in the substrate 100, filling the trenches 11 with an insulating layer, and etching an upper portion of the insulating layer. The device isolation layer 101 may also be described as being formed on the substrate 100. The device isolation layer 101 may be formed to define the active region AR of the substrate 100. The active region AR may include the fins AF. The fins AF may be top portions of the substrate 100 or of the active region AR. Each of the fins AF may have a structure protruding in an upward direction, relative to the top surface of the device isolation layer 101.

Referring to FIG. 5, in conjunction with FIG. 1, the fins AF may be formed to extend parallel to the first direction D1 and may be arranged in the second direction D2. Each of the fins AF may include the gate fin region GAF and the source/drain fin region SDF, on which, in a subsequent process, a gate pattern and the source/drain portion 110 will be respectively formed. When measured in the second direction D2, the gate fin region GAF and the source/drain fin region SDF may be formed to have substantially the same width (e.g., a first width W1). In addition, the gate fin region GAF and the source/drain fin region SDF may be formed to have substantially the same height (e.g., a first height H1). In some embodiments, the substrate 100 may be a silicon wafer, a silicon-germanium wafer, or a germanium wafer. The device isolation layer 101 may be formed of or include a silicon oxide layer.

Figure 6:
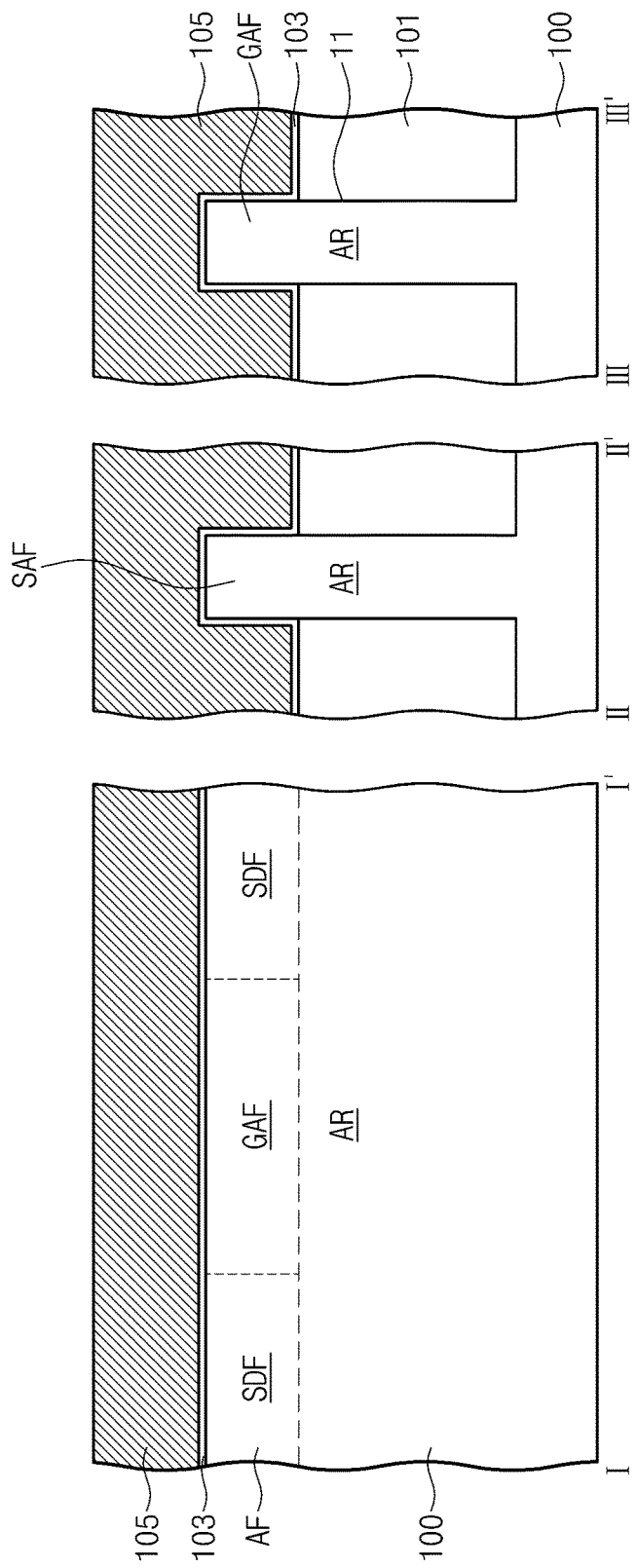

Referring to FIG. 6, an etch stop layer 103 may be formed on the substrate 100. The etch stop layer 103 may be formed to conformally cover surfaces of the fins AF on the active region AR and top surfaces of the device isolation layer 101. The etch stop layer 103 may be formed of or include at least one of oxide materials and high-k dielectric materials. For example, the etch stop layer 103 may be formed of an oxide or nitride layer.

A sacrificial layer 105 may be formed on the etch stop layer 103. The sacrificial layer 105 may include at least one layer having an etch selectivity with respect to the etch stop layer 103. For example, the sacrificial layer 105 may include a poly-silicon layer.

Figure 7:
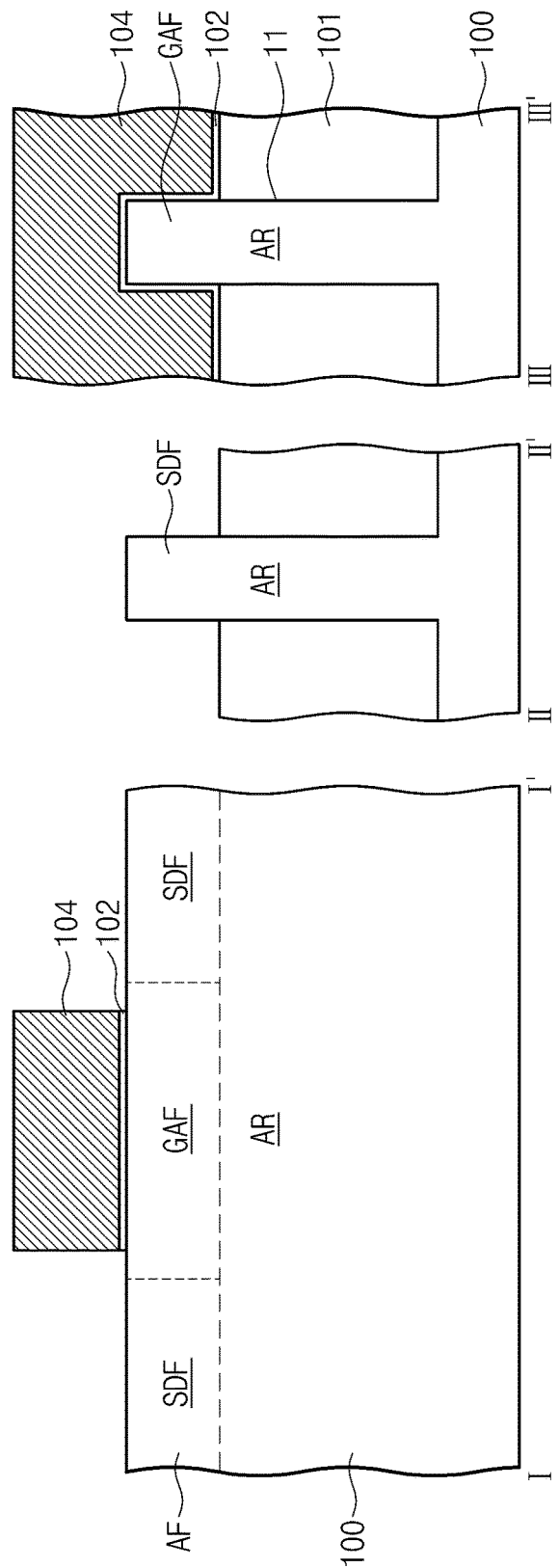

Referring to FIG. 7, the sacrificial layer 105 and the etch stop layer 103 may be sequentially etched to form an etch stop pattern 102 and a sacrificial pattern 104 sequentially stacked on the substrate 100. For example, the formation of the etch stop pattern 102 and the sacrificial pattern 104 may include forming a hard mask pattern on the sacrificial layer 105 and etching the etch stop layer 103 and the sacrificial layer 105 using the hard mask pattern as an etch mask. The sacrificial pattern 104 may be formed to extend in the second direction D2 or to cross the fins AF.

The sacrificial pattern 104 may be disposed on the gate fin region GAF. However, the etching process may be performed to remove the sacrificial layer 105 and the etch stop layer 103 from the source/drain fin region SDF. Accordingly, the sacrificial pattern 104 may be formed to expose the source/drain fin region SDF.

Figure 8:
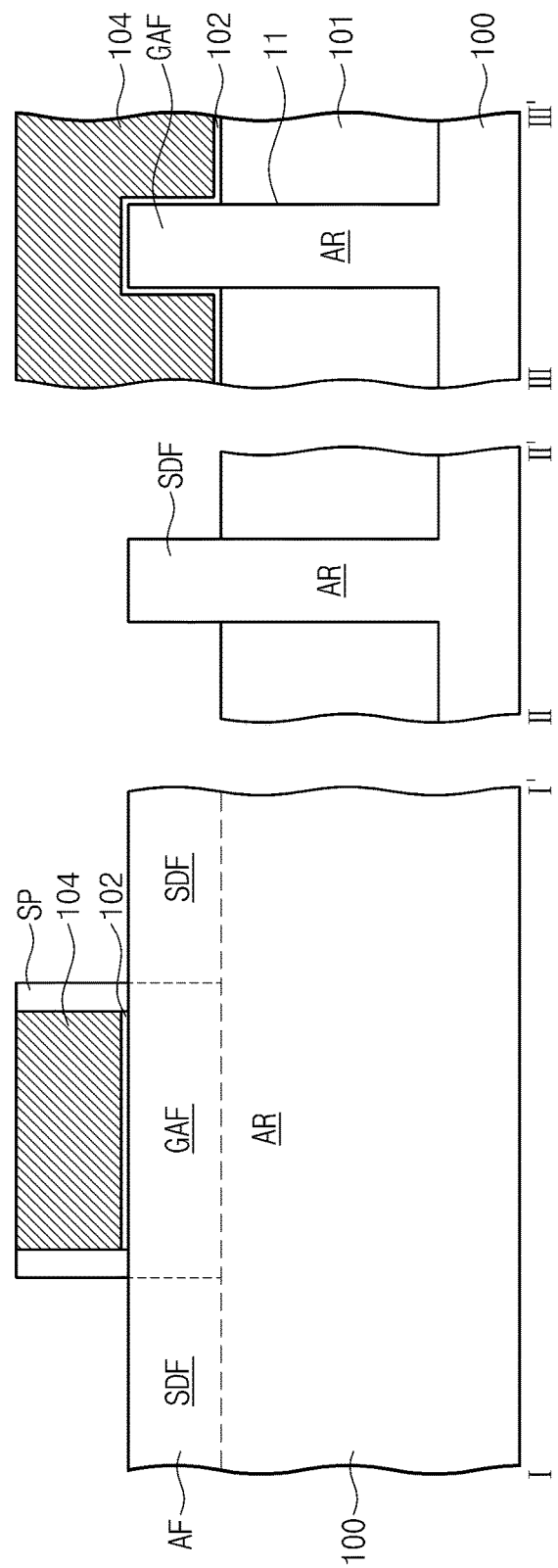

Referring to FIG. 8, the spacers SP may be formed on opposite sidewalls of the sacrificial pattern 104. An insulating layer may be formed to conformally cover the top surfaces of the substrate 100 and the sacrificial pattern 104. Thereafter, an etch-back process may be performed on the insulating layer to form the spacers SP exposing the top surface of the substrate 100. The spacers SP may be formed of or include, for example, a silicon oxide layer or a silicon nitride layer.

Figure 9:
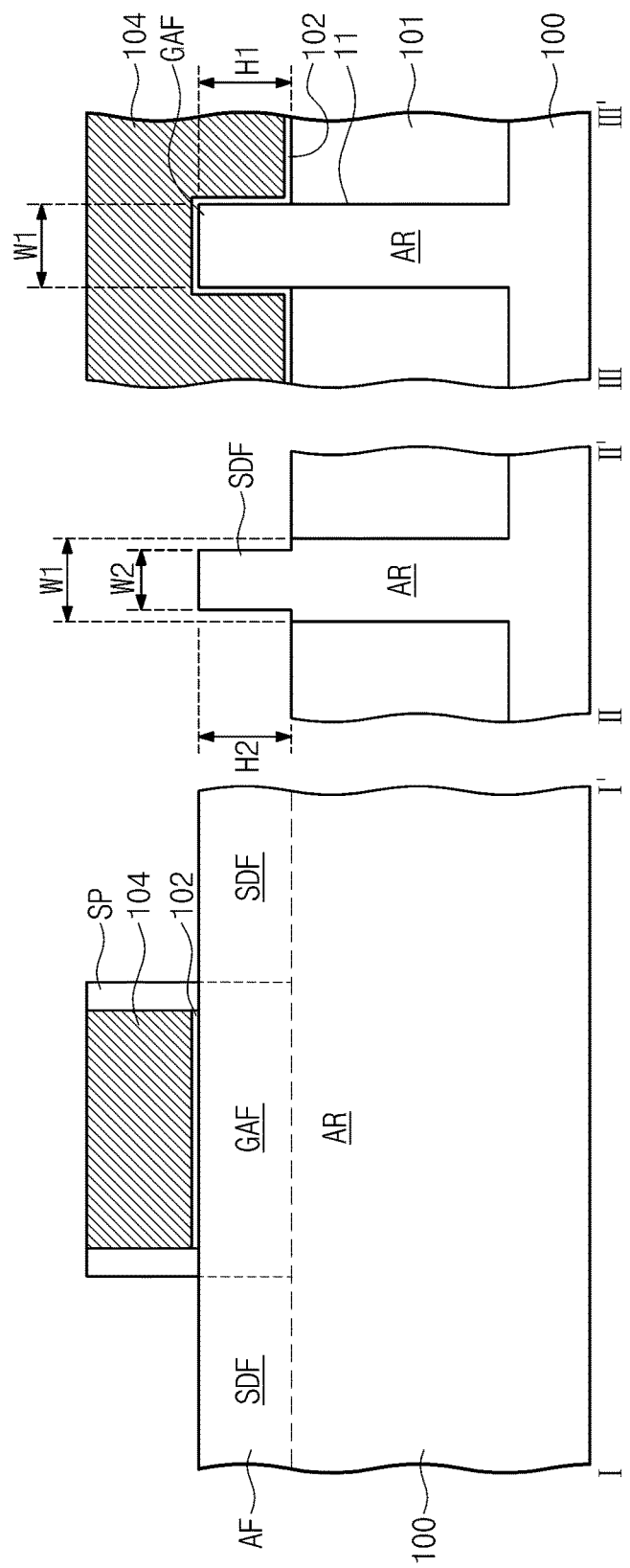

Referring to FIG. 9, a trimming process may be performed on the source/drain fin region SDF. The trimming process may be performed to reduce a horizontal width of the source/drain fin region SDF. As a result of the trimming process, the source/drain fin region SDF may have a second width W2 less than its original width (i.e., the first width W1) (i.e., W2<W1). In addition, the second width W2 of the source/drain fin region SDF may be less than the first width W1 of the non-trimmed gate fin region GAF (i.e., W2<W1). The trimming process may be performed in such a way that a height of the source/drain fin region SDF is not changed; for example, the first height H1 of the source/drain fin region SDF before the trimming process may be substantially equal to a second height H2 of the source/drain fin region SDF after the trimming process (i.e., H1=H2). The second height H2 of the source/drain fin region SDF may be substantially equal to the first height H1 of the gate fin region GAF. Since the gate fin region GAF is covered with the sacrificial pattern 104, the trimming process may not lead to a difference in width of the gate fin region GAF.

In other embodiments, the trimming process may be performed to decrease not only the width of the source/drain fin region SDF but also the height thereof. Referring back to FIGS. 3A and 3B, the second height H2 of the source/drain fin region SDF after the trimming process may be smaller than the first height H1 of the source/drain fin region SDF before the trimming process (i.e., H2<H1). The second height H2 of the source/drain fin region SDF after the trimming process may be smaller than the first height H1 of the gate fin region GAF.

The trimming process may be an etching or cleaning process, which is performed in a wet or dry manner. In the case where a wet etching process or a cleaning process is used as the trimming process, the source/drain fin region SDF may be formed to have a slanted or concave sidewall SW, as shown in FIG. 4B. For example, the source/drain fin region SDF may be formed in such a way that the width W2 of the upper portion thereof is less than the width W4 of the lower portion thereof.

Figure 10:
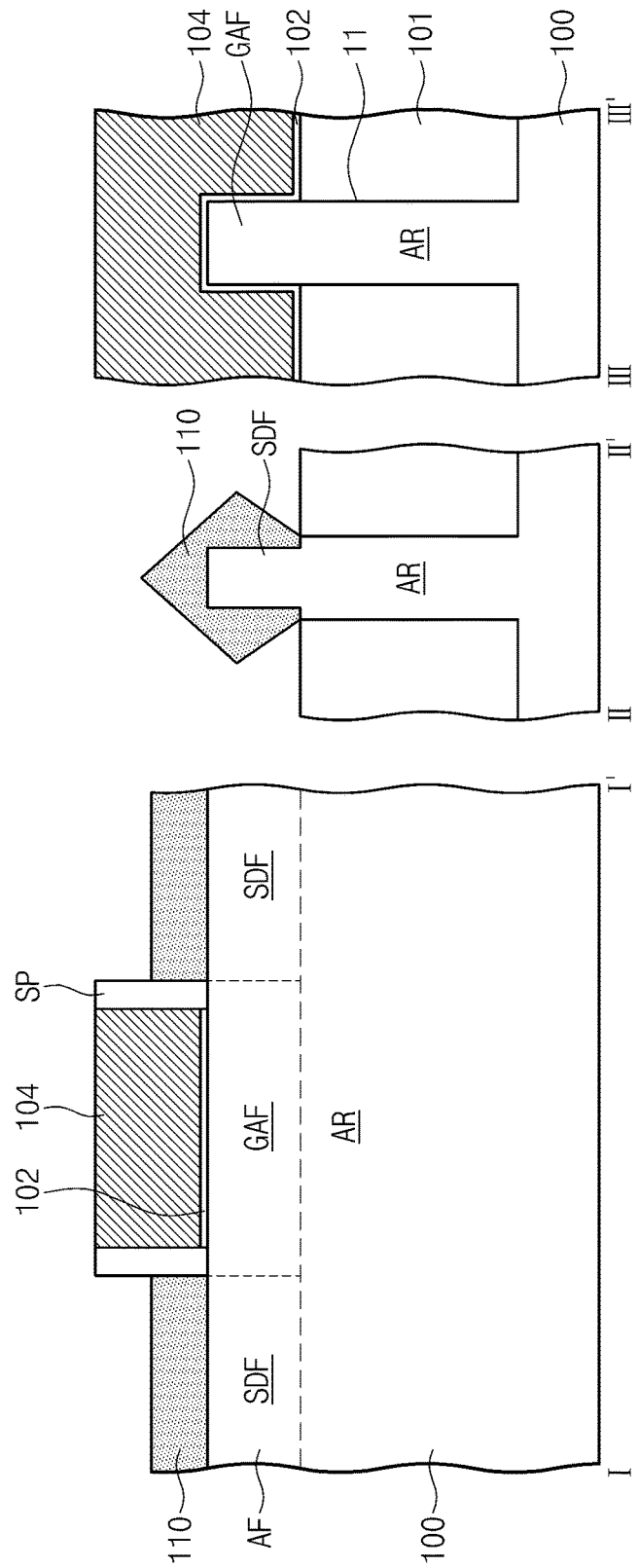

Referring to FIG. 10, the source/drain portion 110 may be formed on the source/drain fin region SDF. For example, the source/drain portion 110 may be formed by an epitaxial growth process using the source/drain fin region SDF as a seed layer. In other words, the source/drain portion 110 may be an epitaxial layer grown from the source/drain fin region SDF.

The source/drain portion 110 may be formed in an in-situ manner. For example, the doping of the epitaxial layer serving as the source/drain portion 110 may be performed at the same time as the epitaxial growth thereof, for example, without a vacuum break in the chamber in which the processes are performed. Accordingly, silicon ions and impurity ions contained in the epitaxial layer may be naturally coupled with each other to form the source/drain portion 110. In this case, it is possible to prevent or suppress bonds between the silicon ions and the impurity ions from being broken during the doping of the source/drain portion 110. In some embodiments, such impurities may be at least one of, for example, phosphorus (P), carbon (C), boron (B), and tin (Sn). The source/drain portion 110 may have a pentagonal vertical section.

Figure 11:
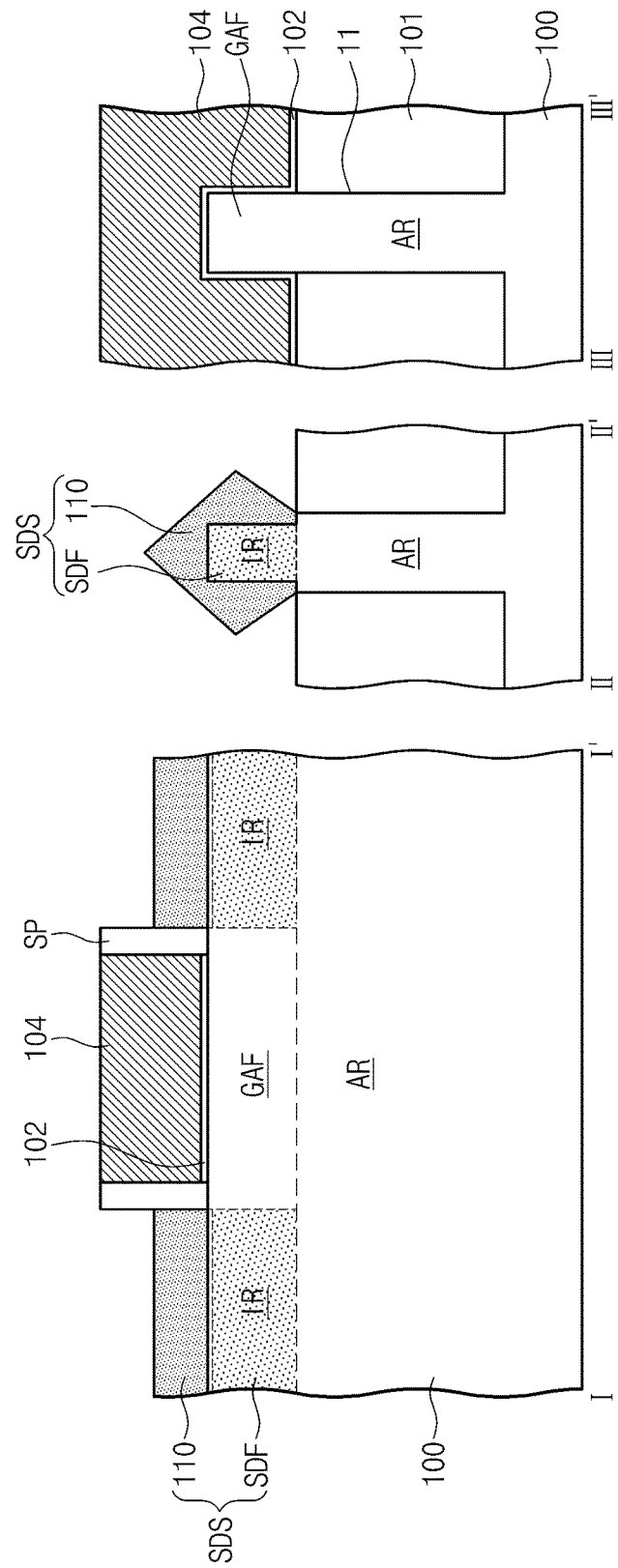

Referring to FIG. 11, a thermal treatment process may be performed on the substrate 100 provided with the source/drain portion 110. As a result of the thermal treatment process, the impurities contained in the source/drain portion 110 may be diffused into the source/drain fin region SDF. Accordingly, the impurity region IR may be formed in the source/drain fin region SDF. The impurity region IR may be locally formed in the source/drain fin region SDF. In some embodiments, the impurity region IR may be formed throughout the source/drain fin region SDF. Since a width of the source/drain fin region SDF is decreased by the trimming process, the impurities may be uniformly diffused in the source/drain fin region SDF. The thermal treatment process may be performed at temperature ranging from about 700° C. to about 1200° C. The source/drain portion 110 and the source/drain fin region SDF with the impurity region IR may constitute the source/drain structure SDS. The source/drain structure SDS may serve as a source/drain electrode of the transistor.

In the conventional fin-FETs, the formation of source/drain structures may include recessing a portion of a fin pattern to expose a substrate and then performing an epitaxial growth process using the exposed portion of the substrate as a seed layer. However, in the case where there is a difference in width and/or depth between the recessed regions, the epitaxial patterns may be formed to have different volumes. As such, there may be a difficulty in forming the source/drain structures with the same volume. A small source/drain structure may be higher than a large source/drain structure, in terms of electric resistance and contact resistance between the source/drain structure and a metal contact thereon. This may lead to deterioration in electric characteristics of a semiconductor device.

By contrast, according to example embodiments of the inventive concept, instead of the recessing process, a trimming process may be locally performed on a portion of a fin pattern (i.e., the source/drain fin region SDF) serving as a source/drain electrode. An epitaxial layer may be formed on the fin pattern, on which the trimming process is performed, and the thermal treatment process may be performed to diffuse impurities from the epitaxial layer into the fin pattern. As a result of the thermal treatment process, the impurity region IR may be formed in the source/drain fin region SDF, and thus, it is possible for a transistor to have desired electric characteristics. This may make it possible to improve electric characteristics of a semiconductor device.

Figure 12:
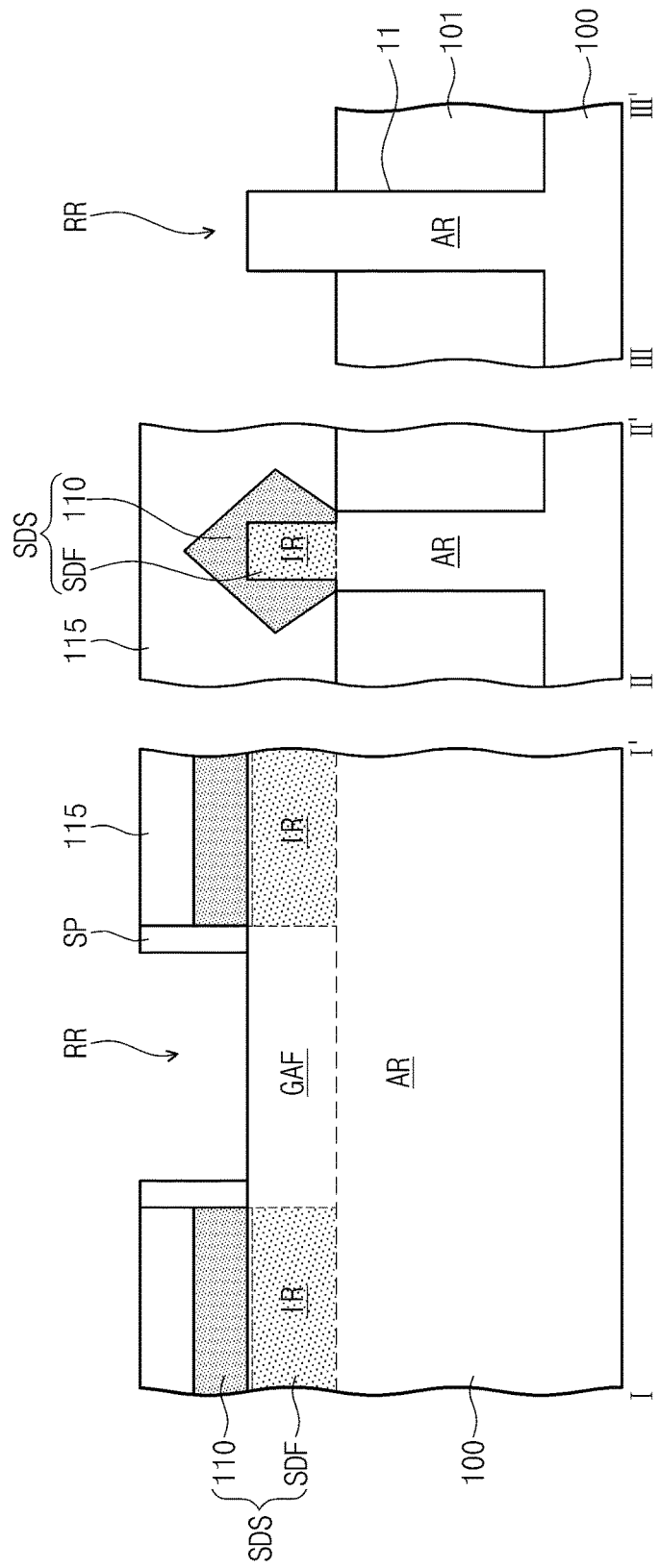

Referring to FIG. 12, the interlayer insulating layer 115 may be formed on the substrate 100 to cover the source/drain portion 110. The interlayer insulating layer 115 may be formed to cover the source/drain portion 110 and the device isolation layer 101 and to expose the sacrificial pattern 104. The interlayer insulating layer 115 may be formed of or include, for example, a silicon oxide layer and/or a silicon nitride layer.

The sacrificial pattern 104 and the etch stop pattern 102 may be selectively removed to form a gap region RR. The gap region RR may be formed to expose the top surface of the gate fin region GAF and the spacers SP. The sacrificial pattern 104 and the etch stop pattern 102 may be selectively removed using an etch recipe having an etch selectivity with respect to the spacers SP and the substrate 100.

Referring back to FIG. 2A, the gate insulating pattern 116 and the gate pattern 117 may be formed in the gap region RR. For example, the gate insulating pattern 116 may be formed in the gap region RR to conformally cover the surface of the gate fin region GAF, the top surface of the device isolation layer 101, and the inner sidewalls of the spacers SP. The gate insulating pattern 116 may be formed of or include at least one of, for example, silicon oxide and high-k dielectric materials (e.g., $HfO_2$, HfSiO, HfSiON, HfON, HfAlO, HfLaO, or $TaO_2$). The gate insulating pattern 116 may be formed by an insulating layer that is conformally formed on the interlayer insulating layer 115 and in the gap region RR. A conductive layer may be formed to fill the gap region RR provided with the insulating layer for the gate insulating pattern 116 and cover the top surface of the interlayer insulating layer 115. Thereafter, the conductive layer and the insulating layer may be polished to expose the top surface of the interlayer insulating layer 115, and thus, the gate insulating pattern 116 and the gate pattern 117 may be locally formed in the gap region RR. The gate pattern 117 may serve as a gate electrode of a transistor. The gate pattern 117 may be formed of or include at least one of metal nitrides (e.g., TiN, TaN, AlN, WN, or MoN), metals (e.g., W, Al, or Cu), metal silicides, and semiconductor materials (e.g., Si).

An upper portion of the gate pattern 117 may be etched. As a result, the gate pattern 117 may be formed to have a top surface positioned below the top surface of the interlayer insulating layer 115. The capping pattern 119 may be formed on the gate pattern 117 to fill the gap region RR. The capping pattern 119 may be formed of or include at least one of, for example, silicon oxide, silicon nitride, and silicon oxynitride.

FIG. 13 is a block diagram illustrating an example of an electronic system including a semiconductor device according to example embodiments of the inventive concept.

Referring to FIG. 13, an electronic system 1100 according to example embodiments of the inventive concept may include a controller 1110, an input-output (I/O) unit 1120, a memory device 1130, an interface 1140, and a data bus 1150. At least two of the controller 1110, the I/O unit 1120, the memory device 1130, and the interface unit 1140 may communicate with each other through the data bus 1150. The data bus 1150 may correspond to a path through which electrical signals are transmitted.

The controller 1110 may include at least one of a microprocessor, a digital signal processor, a microcontroller, or another logic device, which is configured to have a similar function to them. The I/O unit 1120 may include a keypad, a keyboard, or a display unit. The memory device 1130 may store data and/or commands. The interface unit 1140 may transmit electrical data to a communication network or may receive electrical data from a communication network. The interface unit 1140 may operate in a wireless or wired manner. For example, the interface unit 1140 may include an antenna for the wireless communication or a transceiver for the wired and/or wireless communication. Although not shown in the drawings, the electronic system 1100 may further include a fast DRAM device and/or a fast SRAM device that acts as a cache memory for improving an operation of the controller 1110. A semiconductor device according to example embodiments of the inventive concept may be provided as a part of the memory device 1130, the controller 1110, or the I/O unit 1120.

The electronic system 1100 may be applied to an electronic device such as, for example, a personal digital assistant (PDA), a portable computer, a web tablet, a wireless phone, a mobile phone, a digital music player, a memory card, or other electronic products configured to receive or transmit information data by wireless.

The electronic system 1100 may be applied to realize various electronic devices.

FIG. 14 is a schematic view illustrating an example of various electronic devices, to which an electronic system according to example embodiments of the inventive concept can be applied.

As shown in FIG. 14, the electronic system 1100 (e.g., of FIG. 13) may be applied to a mobile phone 1200. However, it will be understood that, in other example embodiments, the electronic system 1100 of FIG. 13 may be applied to portable notebook computers, MP3 players, navigators, solid state drives (SSDs), automobiles, and/or household appliances.

According to example embodiments of the inventive concept, a method of fabricating a semiconductor device may include a trimming process of reducing a width of a source/drain fin region. As a result of the trimming process, it is possible to improve diffusion uniformity in a subsequent diffusion process of diffusing impurities in the source/drain fin region. Accordingly, it is possible to improve electric characteristics of an active region between source/drain electrodes or a channel region, and thereby improving electric characteristics of a semiconductor device.

While example embodiments of the inventive concepts have been particularly shown and described, it will be understood by one of ordinary skill in the art that variations in form and detail may be made therein without departing from the spirit and scope of the attached claims.

What is claimed is:

1. A semiconductor device, comprising:
a substrate including an active region defined by a device isolation layer;
a fin pattern on the active region and extending in a first direction, the fin pattern comprising a gate fin region and a source/drain fin region;
a gate pattern disposed on the gate fin region to extend in a second direction crossing the first direction; and
a source/drain portion provided on a sidewall of the source/drain fin region,
wherein, when measured in the second direction, a width of the source/drain fin region at a height is different from a width of the gate fin region at the height,
wherein the source/drain fin region is a portion of the substrate.

2. The semiconductor device of claim 1, wherein the width of the source/drain fin region is less than the width of the gate fin region.

3. The semiconductor device of claim 2, wherein a width of an upper portion of the source/drain fin region is less than a width of a lower portion of the source/drain fin region.

4. The semiconductor device of claim 1, wherein the gate fin region has a top surface that is positioned at substantially the same level as a top surface of the source/drain fin region.

5. The semiconductor device of claim 1, wherein the gate fin region has a top surface that is positioned at a level different from a top surface of the source/drain fin region.

6. The semiconductor device of claim 5, wherein the top surface of the source/drain fin region is positioned at a level lower than the top surface of the gate fin region.

7. The semiconductor device of claim 1, wherein the source/drain portion is an epitaxial pattern.

8. The semiconductor device of claim 1, wherein the source/drain portion is a conductive pattern.

9. The semiconductor device of claim 1,
wherein the height is a middle height between an upper surface of the device isolation layer and a top surface of the gate fin region,
wherein a distance between an upper surface of the device isolation layer and the middle height is equal to a distance between the middle height and a top surface of the gate fin region.

10. The semiconductor device of claim 1, wherein opposite sidewalls of the source/drain fin region include at least a portion having a slanted profile.

11. The semiconductor device of claim 1, further comprising:
an insulating pattern between the substrate and the gate pattern;
a spacer provided on a sidewall of the gate pattern; and
an interlayer insulating layer provided on the substrate to cover the source/drain portion.

12. A semiconductor device, comprising:
a substrate including an active region defined by a device isolation layer;
a fin pattern on the active region and extending in a first direction, the fin pattern comprising a gate fin region and a source/drain fin region;
a gate pattern provided on the gate fin region to extend in a second direction crossing the first direction; and
a source/drain portion provided on a sidewall of the source/drain fin region,
wherein when measured in the second direction, a width of source/drain fin region is less than a width of the active region,
wherein the source/drain fin region is a portion of the substrate.

13. The semiconductor device of claim 12, wherein the source/drain portion is a conductive pattern.

14. The semiconductor device of claim 12,
wherein, when measured in the second direction, the width of the source/drain fin region is less than a width of the gate fin region.

15. The semiconductor device of claim 14, wherein the width of the active region is the same as the width of the gate fin region.

16. The semiconductor device of claim 12,
wherein the width of the source/drain fin region corresponds to a width of the source/drain fin region at a height,
wherein the width of the gate fin region corresponds to a width of the gate fin region at the height,
wherein the height is a middle height between an upper surface of the device isolation layer and a top surface of the gate fin region, and
wherein a distance between the upper surface of the device isolation layer and the middle height is equal to a distance between the middle height and the top surface of the gate fin region.

17. The semiconductor device of claim 12, wherein the source/drain portion is a conductive pattern.

18. A semiconductor device, comprising:
a substrate including an active region defined by a device isolation layer;
a fin pattern on the active region and extending in a first direction, the fin pattern comprising a gate fin region and a source/drain fin region;
a gate pattern provided on the gate fin region to extend in a second direction crossing the first direction; and
a source/drain portion provided on a sidewall of the source/drain fin region,
wherein when measured in the second direction, a width of source/drain fin region is less than a width of the gate fin region, and a top surface of the source/drain fin region is positioned at a lower level than that of the gate fin region,
wherein a sidewall of the source/drain fin region includes a slanted portion, and
wherein the source/drain fin region is a portion of the substrate.

19. The semiconductor device of claim 18,
wherein the width of the source/drain fin region corresponds to a width of the source/drain fin region at a height, wherein the width of the gate fin region corresponds to a width of the gate fin region at the height, wherein the height is a middle height between an upper surface of the device isolation layer and a top surface of the gate fin region, and wherein a distance between the upper surface of the device isolation layer and the middle height is equal to a distance between the middle height and the top surface of the gate fin region.

20. The semiconductor device of claim 18, wherein the source/drain portion is an epitaxial pattern.

* * * * *

UNITED STATES PATENT AND TRADEMARK OFFICE
CERTIFICATE OF CORRECTION

PATENT NO. : 9,853,160 B2
APPLICATION NO. : 15/135566
DATED : December 26, 2017
INVENTOR(S) : Sujin Jung et al.

It is certified that error appears in the above-identified patent and that said Letters Patent is hereby corrected as shown below:

In the Claims

Column 14, Line 17 Claim 12, insert the word --the-- before the term "source/drain fin region."

Column 14, Line 56 Claim 18, insert the word --the-- before the term "source/drain fin region."

Column 14, Line 60 Claim 18, change the term "a sidewall" to "the sidewall."

Signed and Sealed this
Sixth Day of February, 2018

Joseph Matal
*Performing the Functions and Duties of the
Under Secretary of Commerce for Intellectual Property and
Director of the United States Patent and Trademark Office*